United States Patent [19]
Buehler et al.

[11] Patent Number: 5,332,903
[45] Date of Patent: Jul. 26, 1994

[54] P-MOSFET TOTAL DOSE DOSIMETER

[75] Inventors: Martin G. Buehler, LaCanada; Brent R. Blaes, San Dimas, both of Calif.

[73] Assignee: California Institute of Technology, Pasadena, Calif.

[21] Appl. No.: 983,380

[22] Filed: Nov. 30, 1992

Related U.S. Application Data

[63] Continuation-in-part of Ser. No. 956,252, Oct. 5, 1992, which is a continuation-in-part of Ser. No. 672,705, Mar. 19, 1991.

[51] Int. Cl.$^5$ .............................. H01L 31/119
[52] U.S. Cl. ..................... 250/370.14; 250/370.15; 257/428
[58] Field of Search ............ 250/370.07, 370.14, 250/370.15; 257/428, 429, 290, 291, 292

[56] References Cited

U.S. PATENT DOCUMENTS

| | | | |
|---|---|---|---|
| 3,570,112 | 3/1971 | Barry et al. | 257/428 |
| 4,788,581 | 11/1988 | Knoll et al. | 250/370.07 |
| 4,808,834 | 2/1989 | Kimata | 250/578 |
| 4,996,576 | 2/1991 | Lynch et al. | 257/428 |

OTHER PUBLICATIONS

Thomson et al. "Radiation Dosimetry with MOS Sensors", Rad. Protect. Dosimetry, vol. 6, No. 1–4 pp. 121–124 (1984).

Soubra et al, "MOSFET Dosimeters as Rad. Det.", Conference: Amer. Asso. of Phys. in Med. (1990) St. Louis, Mo.

Primary Examiner—Paul M. Dzierzynski
Assistant Examiner—Richard Hanig
Attorney, Agent, or Firm—Leonard Tachner

[57] ABSTRACT

A p-MOSFET total dose dosimeter where the gate voltage is proportional to the incident radiation dose. It is configured in an n-WELL of a p-BODY substrate. It is operated in the saturation region which is ensured by connecting the gate to the drain. The n-well is connected to zero bias. Current flow from source to drain, rather than from peripheral leakage, is ensured by configuring the device as an edgeless MOSFET where the source completely surrounds the drain. The drain junction is the only junction not connected to zero bias. The MOSFET is connected as part of the feedback loop of an operational amplifier. The operational amplifier holds the drain current fixed at a level which minimizes temperature dependence and also fixes the drain voltage. The sensitivity to radiation is made maximum by operating the MOSFET in the OFF state during radiation soak.

12 Claims, 2 Drawing Sheets

P-MOSFET TOTAL DOSE DOSIMETER

ORIGIN OF INVENTION

The invention described herein was made in the performance of work under a NASA contract, and is subject to the provisions of Public Law 96-517 (35 USC 202) in which the Contractor has elected to retain title.

CROSS-REFERENCE TO RELATED APPLICATIONS

This application is a continuation-in-part of application Ser. No. 07/956,252 filed Oct. 5, 1992 which is a continuation-in-part of application Ser. No. 07/672,705 filed Mar. 19, 1991.

TECHNICAL FIELD

The present invention relates to MOSFET dosimetry and more specifically to an improved dosimeter providing increased accuracy in reading total radiation exposure by eliminating temperature effects.

BACKGROUND ART

The space radiation effects of concern to modern microcircuits are Single-Event Upsets (SEUs) and Total Ionizing Dose (TD). In the SEU effect, cosmic rays and high energy protons, that undergo electronic reactions with the integrated circuits, deposit sufficient charge in memory cells and latches to flip bits and corrupt data. Such events do not induce any physical damage and thus are nondestructive. On the other hand, in the TD effect, gate oxides are charged which is a permanent change. This shifts transistor threshold voltages and reduces the channel mobility. A change in these parameters degrades the performance of CMOS integrated circuits (ICs) by changing the propagation delay.

Radiation sensitive field effect transistors have application as integrating dosimeters providing a measurement of the amount of dose absorbed from various radiation sources. Field effect transistor (FET) dosimeters are advantageous as compared to more conventional dosimeters because FET dosimeters are small and they provide continuous readout. They operate on the principle that ionizing radiation causes a shift in threshold voltage due to the accumulation of trapped charge in the gate oxide and at the oxide interface. Unfortunately, FET dosimeters also suffer from a number of shortcomings. In particular, their sensitivity to radiation is low and their accuracy is diminished by changes in threshold voltage caused by temperature variations. Thus it would be highly desireable to have an FET dosimeter which is relatively insensitive to variations in temperature.

SUMMARY OF THE INVENTION

The present invention comprises a p-MOSFET total dose dosimeter where the gate voltage is proportional to the incident radiation dose. It is configured in an n-WELL of a p-BODY substrate. It is operated in the saturation region which is ensured by connecting the gate to the drain. The n-well is connected to zero bias. Current flow from source to drain, rather than from peripheral leakage, is ensured by configuring the device as an edgeless MOSFET where the source completely surrounds the drain. The drain junction is the only junction not connected to zero bias. The MOSFET is connected as part of the feedback loop of an operational amplifier. The operational amplifier holds the drain current fixed at a level which minimizes temperature dependence and also fixes the drain voltage. The sensitivity to radiation is made maximum by operating the MOSFET in the OFF state during radiation soak.

OBJECTS OF THE INVENTION

It is therefore a principal object of the present invention to provide a p-MOSFET total dose dosimeter with increased radiation sensitivity and decreased temperature sensitivity.

It is another object of the invention to provide an improved dosimeter yielding more accurate readings of total radiation exposure by eliminating temperature effects.

It is another object of the invention to provide more accurate dosimeter measurement by employing a p-MOSFET dosimeter in which the MOSFET is edgeless to eliminate leakage current and in which an operational amplifier virtual ground fixes the drain current at a magnitude selected to substantially eliminate temperature sensitivity.

BRIEF DESCRIPTION OF THE DRAWINGS

The aforementioned objects and advantages of the present invention, as well as additional objects and advantages thereof, will be more fully understood hereinafter as a result of a detailed description of a preferred embodiment of the invention when taken in conjunction with the following drawings in which.

DETAILED DESCRIPTION OF A PREFERRED EMBODIMENT

Dosimetry via MOSFET threshold voltage shifts is influenced by at least two second order effects. These must be compensated out by design or included in the data analysis in order to obtain accurate dose measurements. The second order effects are (a) the radiation sensitivity of the transconductance factor, KP, via radiation-induced mobility, $\mu$, degradation and (b) the temperature sensitivity of both of these effects. In addition the total operation of the device must be considered in order to obtain accurate dose measurements.

Figure 1:
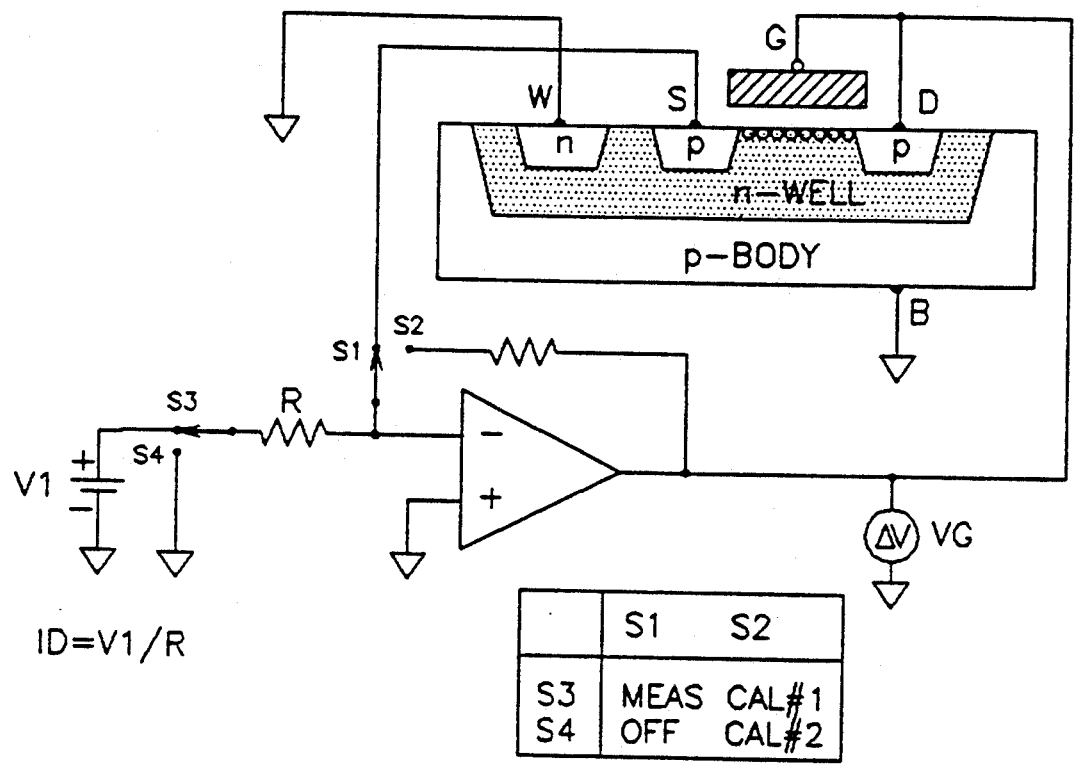
FIG. 1 is a schematic diagram of the dosimeter of the present invention.

The p-MOSFET is operated in the saturation region which is ensured by connecting the gate to the drain as seen in FIG. 1. For this case the drain current is given by:

$$ID = \frac{KP \cdot W}{2L}(VG - VT)^2$$

the above square-law relationship is written as a VG-expression:

$$VG = VT + \sqrt{[2ID \cdot L/(KP \cdot W)]}$$

The radiation sensitivity is:

$$S = dVG/dVT = 1$$

The temperature dependence is determined by expanding VT and KP in a Taylor Series:

$$VT - VT_o - VT_T(T - T_o)$$

where T is the absolute temperature, $T_o$ is room temperature, and $VT_T = |dVT/dT|$. The temperature dependence of KP is:

$$KP = KP_o(T/T_o)^{-n}$$

and the Taylor Series expansion is:

$$KP - KP_o - KP_T(T - T_o)$$

where $KP_T = |dKP/dT| = n \cdot KP_o/T_o$ and n is between 1.5 and 2.0.

Figure 2:
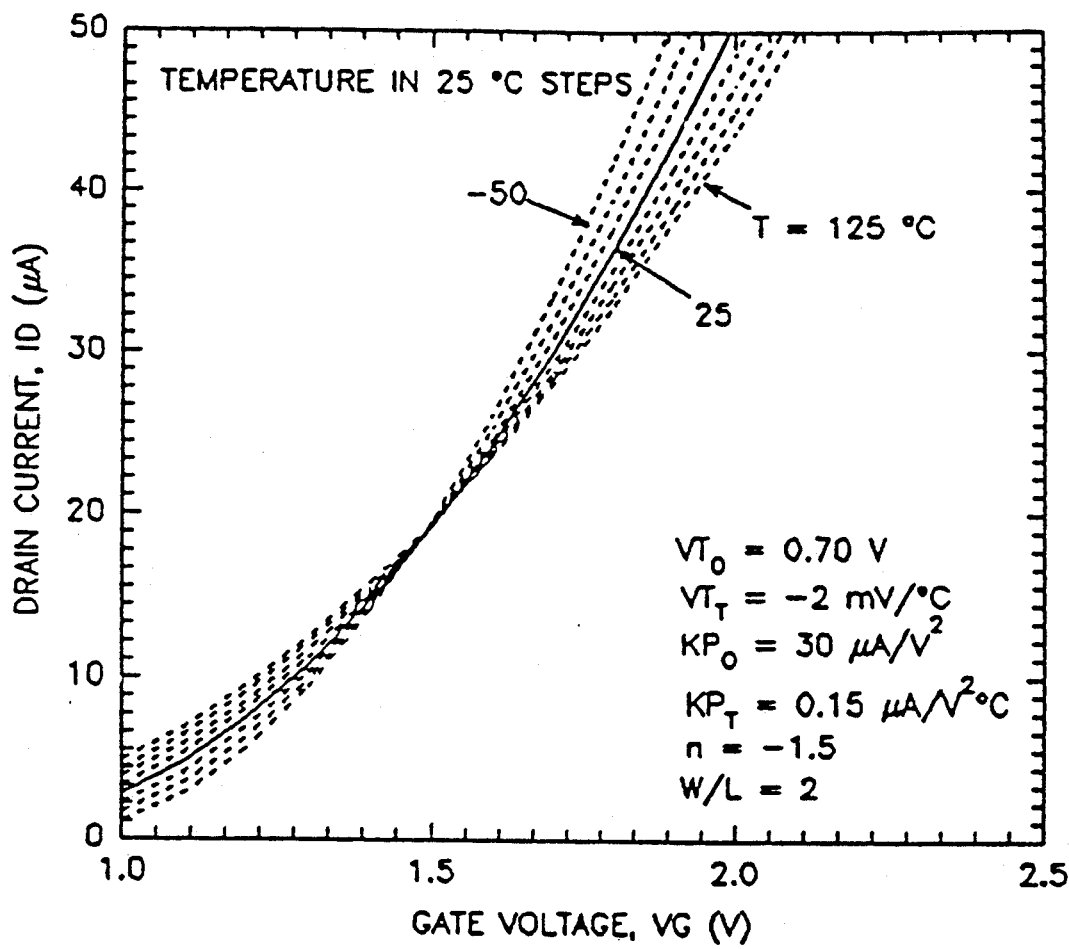
FIG. 2 is a graph of the temperature dependence of the dosimeter of the invention showing the drain current point at which the dosimeter operation is temperature independent.

Substituting the above two equations into the VG-expression yields:
$$VG = VG_o + \{-VT_T + \sqrt{[ID \cdot L \cdot KP_T^2/(2 \cdot KP_o^3 W)]}\}(T - T_o)$$

where $VG_o = VT_o + \sqrt{[2ID \cdot L/(KP_o \cdot W)]}$. The above derivation used the approximation $1/\sqrt{(1-x)} = 1 + x/2$ for small values of x. Thus VG will be independent of T for:

$$ID = 2KP_o VT_o^2 (W/L) [(VT_T/VT_o)/(KP_T/KP_o)]^2$$

where ID = 19.2 μA for a MOSFET length of 1.6 μm and width of 3.2 μm and for the parameters given in FIG. 2 where the temperature dependence is shown explicitly.

The total dose, D, is evaluated is a similar manner. The Taylor series expansions for VT and KP are:

$$VT = VT_o + VT_D \cdot D$$

where the VT damage coefficient is $VT_D = dVT/dD$ and $$KP = KP_o - KP_D \cdot D$$

where the KP damage coefficient is $KP_D = dKP/dD$. Substituting the above VT and KP expressions into the VG-expression leads to:

$$D = (VG - VG_o)/(VT_D + KP_D \cdot VT_T/KP_T)$$

where again the approximation of $1/\sqrt{(1-x)}$ was used.

The above dose expression requires the evaluation of $VT_D$ and $KP_D$ which is done using Co-60 irradiation. In this evaluation dose rate effects must be evaluated and then extrapolated to operating conditions. The temperature coefficients, $VT_T$ and $KP_T$, are determined from temperature measurements.

The p-MOSFET dosimeter operating modes include: MEASure, OFF (soak/power down), CALibrate 1 and CALibrate 2. For maximum sensitivity to radiation, p-MOSFETs should be operated in the OFF state during the soak state. In the OFF state the electric field is directed from the gate toward to silicon. This means that during the radiation damage process when positive oxide charge is mobile, it will be distributed more toward the silicon which makes the MOSFET harder to turn on. This can be achieved in the implementation shown in FIG. 1 by applying zero bias to the gate. This requirement has the advantage that the soak and power down state will be identical and means the MOSFET will be operated in a consistent bias state providing a well-known biasing scenario. The key to this bias requirement is that the n-well be connected to a zero potential and not be biased to VDD as is the normal cas in integrated circuit design.

The design of the dosimeter requires current flow only from source to drain and not via a peripheral leakage path. Thus the device is designed as an edgeless MOSFET where the source completely surrounds the drain. In addition, all junctions are held at zero bias except for the drain junction. The operational amplifier holds the source at zero bias providing a drain current ID = V1/R. The drain voltage is fixed by the amplifier at VG which, for the case of the p-MOSFET, is negative.

Having thus disclosed an exemplary embodiment of the invention, what is claimed is:

1. A total dose dosimeter comprising:
   a p-MOSFET configured in a zero-biased n-WELL;
   an operational amplifier having a feedback loop;
   said p-MOSFET being connected into said feedback loop, the gate and drain of said p-MOSFET being connected to the output of said operational amplifier and the source of said p-MOSFET being connected to an input of said operational amplifier;
   the gate voltage of said p-MOSFET being proportional to total radiation dose incident upon said p-MOSFET.

2. The dosimeter recited in claim 1 wherein said p-MOSFET is operated in its saturation region.

3. The dosimeter recited in claim 1 wherein said source physically surrounds said drain to prevent peripheral current leakage between said source and said drain.

4. The dosimeter recited in claim 1 wherein the drain current in said p-MOSFET is fixed by said operational amplifier at a magnitude where temperature variations have substantially no affect on gate voltage.

5. The dosimeter recited in claim 1 further comprising a resistor having a resistance R and a voltage V also connected to said input of said operational amplifier, the drain current ID of said p-MOSFET being fixed at ID = V/R by the virtual ground effect of said operational amplifier.

6. The dosimeter recited in claim 5 wherein ID is fixed, by selecting V and R, at a level which makes the gate voltage of said p-MOSFET substantially insensitive to temperature.

7. The dosimeter recited in claim 1 further comprising means for turning said p-MOSFET to an OFF state during radiation exposure and to an ON state for measurement of accumulated total radiation dose.

8. A p-MOSFET total dose dosimeter substantially insensitive to temperature variations and comprising:
   a p-MOSFET in which the source is made to physically surround the drain to prevent peripheral leakage current between said source and said drain; and
   means to fix the drain current at a constant magnitude where gate voltage is independent of ambient temperature.

9. The dosimeter recited in claim 8 wherein said drain current fixing means comprises the virtual ground effect of an operational amplifier and said p-MOSFET is connected into the feedback loop of said operational amplifier.

10. The dosimeter recited in claim 9 wherein the gate and drain of said p-MOSFET are both connected to the output of said operational amplifier and the source of said p-MOSFET is connected to the input of said operational amplifier.

11. The dosimeter recited in claim 9 wherein said drain current is fixed by a selected fixed voltage and resistance connected to the input of said operational amplifier.

12. The dosimeter recited in claim 8 wherein said p-MOSFET is configured in a zero-biased n-well in a p-BODY substrate.

* * * * *